United States Patent [19]

Wei

[11] Patent Number: 6,112,022
[45] Date of Patent: Aug. 29, 2000

[54] METHOD FOR SIMULATING ULSI/VLSI CIRCUIT DESIGNS

[75] Inventor: You-Pang Wei, Los Altos, Calif.

[73] Assignee: Legend Design Technology, Inc., Los Altos, Calif.

[21] Appl. No.: 08/766,358

[22] Filed: Dec. 13, 1996

[51] Int. Cl.[7] .................................................. G06F 17/50
[52] U.S. Cl. ............................ 395/500.35; 395/500.06
[58] Field of Search .................................. 364/488, 489, 364/490, 491; 395/500.34

[56] References Cited

U.S. PATENT DOCUMENTS

| | | | |
|---|---|---|---|
| 5,400,270 | 3/1995 | Fukui et al. | 364/578 |
| 5,553,008 | 9/1996 | Huang et al. | 364/578 |
| 5,598,344 | 1/1997 | Dangelo et al. | 364/489 |
| 5,706,477 | 1/1998 | Goto | 364/488 |
| 5,740,347 | 4/1998 | Avidan | 395/183.09 |

*Primary Examiner*—Kevin J. Teska
*Assistant Examiner*—Thuan Do
*Attorney, Agent, or Firm*—Claude A.S. Hamrick; Emil Chang; Oppenheimer Wolff & Donnelly LLP

[57] ABSTRACT

A method for identifying and selecting pertinent subcircuits from a given circuit design for generating simulation results representative of the given circuit design is disclosed. A large circuit design having a number of input pins and output pins, and one or more clock pins can be simulated by a number of subcircuits where each subcircuit is comprised of circuit information from an input pin to one or more latch devices, an output pin to one or more latch devices, or an output pin to one or more input pins. A latch device can be a flip-flop.

25 Claims, 11 Drawing Sheets

Fig. 8

METHOD FOR SIMULATING ULSI/VLSI CIRCUIT DESIGNS

BACKGROUND OF THE INVENTION

1. Field of the Invention

The present invention generally relates to circuit simulation methods and, in particular, a method for selecting pertinent subcircuits from a VLSI/ULSI circuit design in the simulation and characterizing of the VLSI/ULSI circuit design.

2. Description of the Prior Art

A modern day integrated circuit design may have millions of transistors. Simulation of these Very Large Scale Integrated (VLSI) circuit designs or Ultra Large Scale Integrated (ULSI) circuit designs becomes a time consuming proposition requiring not only a high speed computer but complex simulation software as well.

In conducting these simulations, all of the transistors and distinct circuit components along with their interrelationships as defined by the user (typically in a SPICE netlist) are loaded into computer memory and simulated. Given the size of these circuit designs, the computer performing the simulation necessarily has to be a fairly powerful computer with substantial amount of memory. Even with such a computer, the simulation of the circuit design may still require many hours to many days of computing time.

When circuit designs continue to increase in size, the traditional simulation methods and software tools become impractical due to the time required in simulating these circuit designs. Thus, there is a need for novel methods for simulating large circuit designs.

SUMMARY OF THE INVENTION

It is therefore an object of the present invention to provide a method for simulating large circuit designs while requiring minimal computing power.

It is another object of the present invention to provide a method for identifying a particular circuit pattern in a given circuit design.

It is yet another object of the present invention to provide a method for selecting pertinent subcircuits from a given circuit design in simulating that given circuit design.

It is still another object of the present invention to provide a method for selecting and adding parameters to the selected subcircuits in characterizing the given circuit design.

Briefly, a method for identifying and selecting pertinent subcircuits from a given circuit design for generating simulation results representative of the given circuit design is disclosed. A large circuit design having a number of input pins and output pins, and one or more clock pins can be simulated by a number of subcircuits where each subcircuit is comprised of circuit information from an input pin to one or more latch devices, an output pin to one or more latch devices, or an output pin to one or more input pins. A latch device may be a flip-flop.

The conceptual framework here is that in simulating a circuit design, we are interested in the characteristics of the signals at the input pins, the output pins, and, in some cases, the clock pin(s). Since for a given clock cycle, information of interest at a particular input pin is affected by the circuit components from the particular input pin to one or more latches within the circuit design. Thus, in simulating and characterizing that particular input pin, only the circuit components between the pertinent input pin(s) and latches relevant to that particular input pin need to be extracted and simulated in finding the characteristics of the signal at that particular input pin.

Similarly, for a particular output pin, at any one clock cycle, the characteristics and state of the signal at that particular output pin is affected by the circuit components (from one or more latches and/or input pins) upstream in the signal path leading to that particular output pin. Thus, only the circuit components from the latches and/or input pins leading to the particular output pin need to be extracted in simulating the signal at that particular output pin.

After a subcircuit for a particular input pin or output pin has been determined, it can be extracted from the given circuit design. In extracting the subcircuit, load devices are added to the subcircuit at the cut-out points of the subcircuit in order to represent the load induced by neighboring devices. After the subcircuit has been extracted, user-specified parameters for this particular pin are added to the subcircuit in the simulation of this particular pin.

In the case in which an output pin is not connected to a latch in its upstream signal path, the entire subcircuit from the output pin back to one or more input pins is extracted in simulating this particular output pin.

Three specific examples using different embodiments of the present invention are provided herein. In one example, an embodiment for memory circuit design simulation is illustrated. In another example, an embodiment for clock tree circuit design simulation is illustrated. Yet in a third example, an abstraction of a circuit design from the transistor level to the gate level is illustrated.

Implementation wise, a given circuit design is typically defined by an user-provided SPICE netlist file. A subcircuit extracted therefrom is also SPICE netlist file. Though it is understood that the present invention and embodiments are not limited to a specific implementation methods and tools.

Thus, an advantage of the present invention is that it provides a method for simulating large circuit designs while requiring minimal computing power.

Another advantage of the present invention is that it provides a method for identifying a particular circuit pattern in a given circuit design.

Yet another advantage of the present invention is that it provides a method for selecting pertinent subcircuits from a given circuit design in simulating the given circuit design.

Still another advantage of the present invention is that it provides a method for selecting and adding parameters to the selected subcircuits in characterizing the given circuit.

DETAILED DESCRIPTION OF THE PREFERRED EMBODIMENTS

Figure 1A:
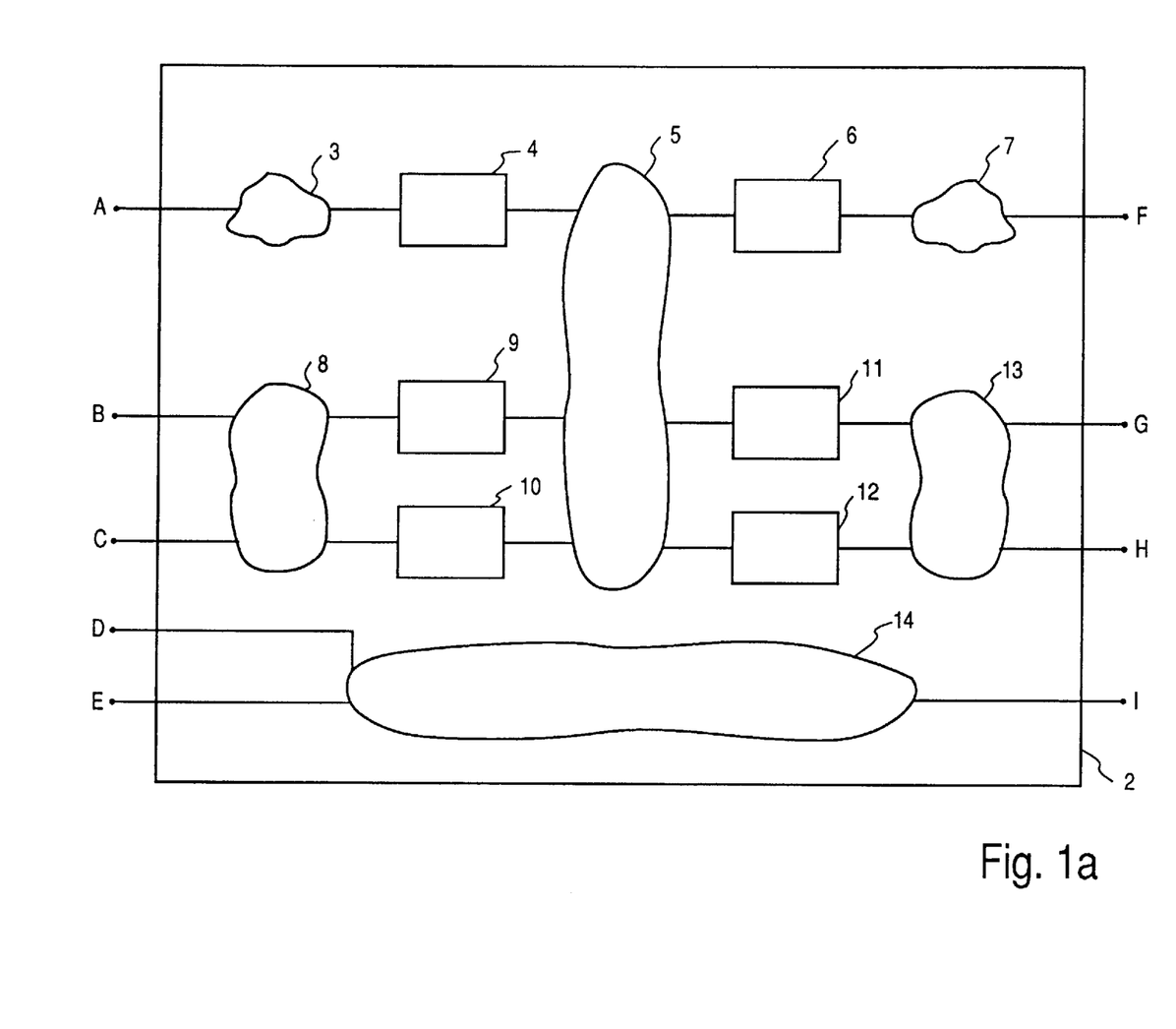
FIG. 1a conceptually illustrates a general layout of a circuit design.

FIG. 1a illustrates the general layout of a circuit design where each odd shape represents a subcircuit and each rectangular box represents a latch. Input pin A connects to subcircuit 3 which is connected to latch 4. Latch 4 connects to subcircuit 5 which is connected to latch 6. Latch 6 connects to subcircuit 7, which is connected to output pin F. In extracting a subcircuit for measuring the timing and characteristics of the signal at pin A, subcircuit 3 and latch 4 would be extracted for pin A. Since for a given clock cycle, the timing and characteristics of the signal at pin A is only affected by the circuitry from pin A to latch 4, no part of subcircuit 5 and downstream circuitries would affect the signal at pin A. Similarly, viewing from output pin F and extracting a subcircuit for the purpose of simulating the timing and characteristics of the signal at output pin F, only subcircuit 7 and latch 6 would be extracted to simulate the signal at output pin F.

To simulate the timing and characteristics of the signal at input pin B, subcircuit 8 and latches 9 and 10 would be found to affect the signal at pin B and these subcircuitries would be extracted. In simulating and generating the signal at pin B, the timing and characteristics of the signal at input pin C would be fixed. In a likewise manner, the same subcircuit would be extracted to simulate the signal at input pin C since it connects to the same circuitry. Similarly, in simulating input pin C, the timing and characteristics of the signal at input pin B is fixed.

Subcircuit 5 connects to latches 11 and 12 which are connected to subcircuit 13, and subcircuit 13 connects to output pins G and H. Thus, in extracting a subcircuit to represent the timing and characteristics of the signal at output pin G, latches 11 and 12 and subcircuit 13 would be extracted, and the same circuit would be extracted to simulate the signal at output pin H.

As for input pins D and E which are connected to subcircuit 14 and output pin I, since there are no latches, all of subcircuit 14 would be extracted for each of input pins D and E, and output pin I. We now proceed to the methods in identifying and extracting the subcircuits.

Figure 1B:
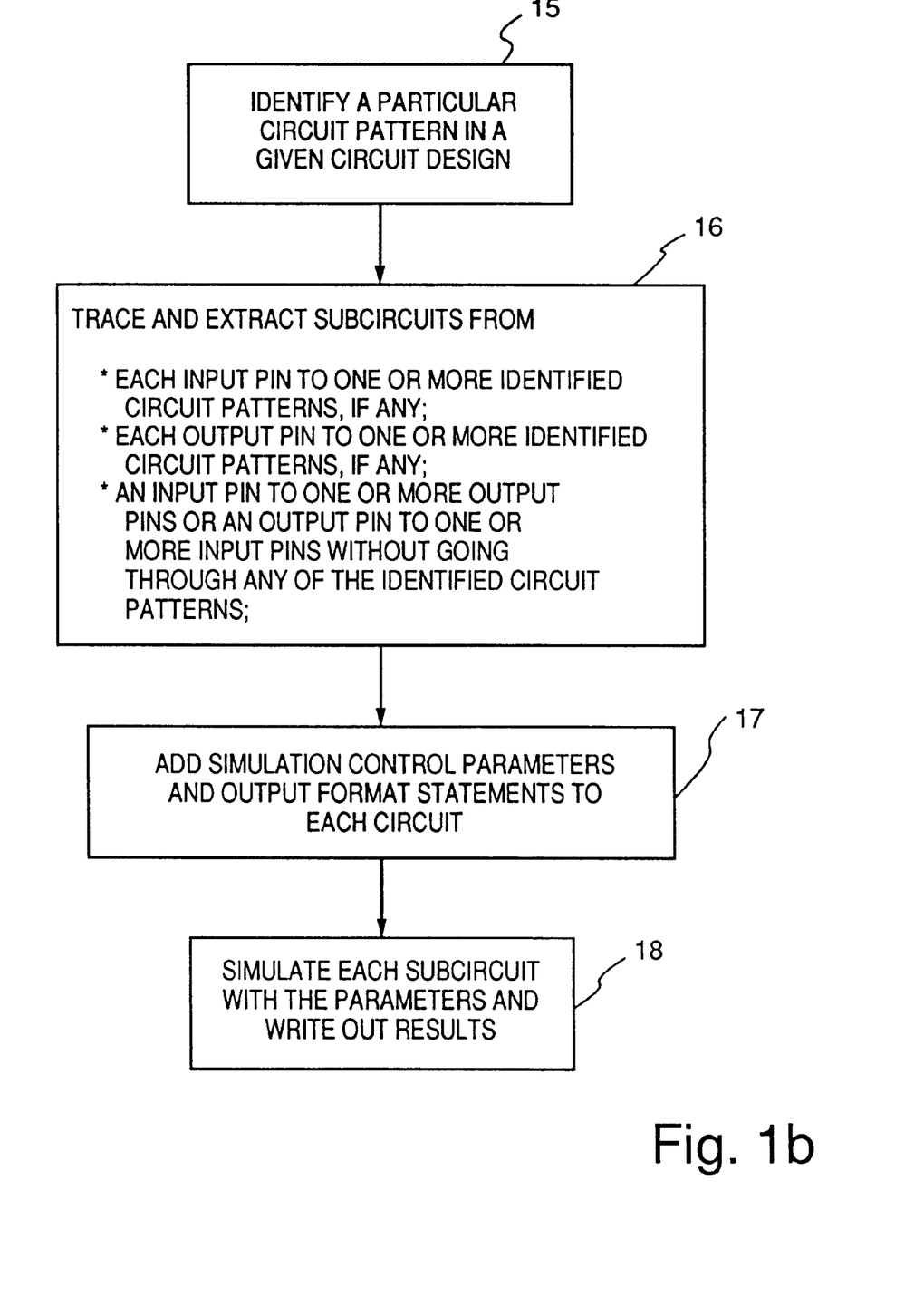
FIG. 1b illustrates a flow chart of the general steps of the preferred method of the present invention.

Referring to FIG. 1b, the general steps of the preferred method of the present invention are illustrated. Generally speaking, the particular circuit pattern representing the latch is provided in the form of a netlist by the user, and the locations of that particular circuit pattern in the to-be-simulated circuit design are identified 15.

After all of the circuit patterns have been identified in the circuit design, a subcircuit is extracted for each pin of the circuit design from the circuit design. A subcircuit for the simulation of an input pin is determined by tracing the input pin to one or more latches, and the circuitry from the input pin to the found latches are cut out and placed in a netlist file of its own. The same process is applied to each of input pins and each of the output pins 16.

There may be certain input pins and output pins not connected to any latches. In this case, by tracing from an output pin back to the input pins related to this output pin, all of the circuitries in between the particular output pin and input pins are cut out as a subcircuit for the simulation of that output pin 16.

When each subcircuit is cut out from the circuit design, capacitance and resistance loads are added at the cut out points in order to maintain accurate circuit characteristics 17. Additionally, user-specified parameters provided in the netlist of the given circuit design are added to the SPICE netlist for the subcircuits 17. Finally, the subcircuit for each of the input pins and output pins are simulated to generate the timing and characteristics of the signals at each respective pin 18. The output from each of the subcircuits is then made available to the user in a format of the user's choice 18.

Figure 2:
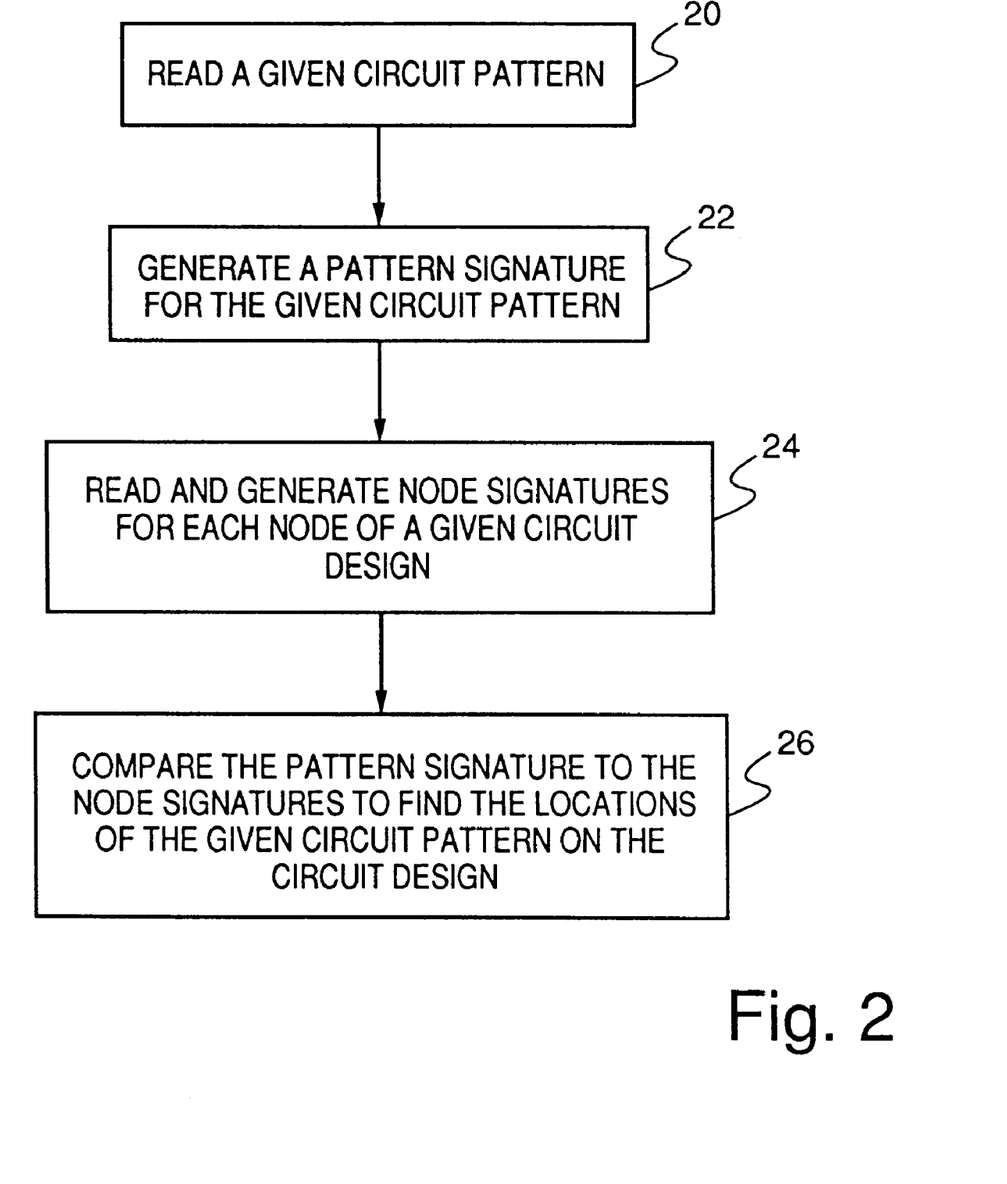
FIG. 2 illustrates a flow chart of the general steps in searching for a circuit pattern in a given circuit design.

FIG. 2 further illustrates the substeps of the step (box 15 of FIG. 1b) in identifying the locations of the particular circuit pattern in a given circuit design. In this process, first, the desired circuit pattern which is provided by the user and typically in a SPICE netlist, is read 20. In the next step 22, a pattern signature for this particular circuit pattern is generated. In generating a pattern signature, each node of the circuit pattern is identified as an internal node or an external node where an internal node is a node not connected to any circuit components outside of the circuit pattern and an external node is a node that can connect to components not part of the circuit pattern. For each of the nodes, either internal or external, the characteristics of that node as defined by the surrounding components are noted and marked in pre-defined fields of a bit pattern. The bit pattern is a simple bit word of a pre-defined length with predetermined fields of various length, each field corresponding to a node characteristic. Some of the node characteristics include:

1. the number of connections to P channel transistors;
2. the number of connections to N channel transistors;
3. the type of logic gate connections (e.g.: Inverter, NOR, NAND);
4. the type of power path, if any (e.g. ground, Vcc) and
5. the number of connections to transistor gate terminals, drain terminals, and source terminals.

Figure 3:
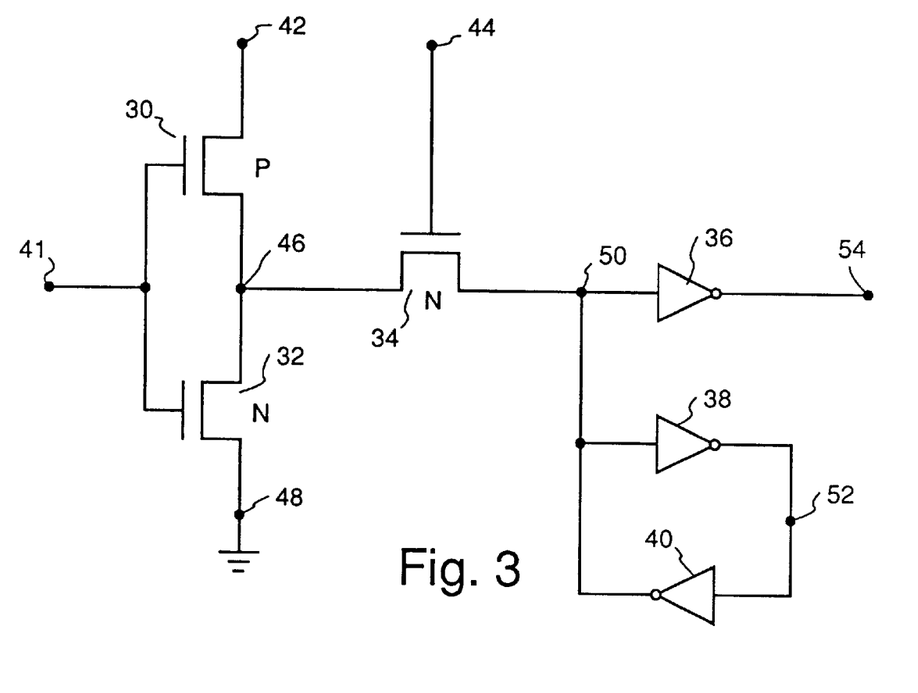
FIG. 3 illustrates the schematic diagram for a particular circuit pattern.

For illustration purposes, referring to FIG. 3, a sample circuit pattern for a latch is illustrated. In this pattern, there is a P-channel transistor 30, two N-channel transistors 32 and 34, and three inverters 36, 38, and 40. These components are connected in such a manner giving rise to five external nodes, nodes 41, 42, 44, 48, and 54, and three internal nodes, nodes 46, 50 and 52.

A bit pattern is generated for each of the nodes. For example, node 46 is connected to one P transistor 30, two N transistors 32 and 34, one inverter (combination of 30 and 32), three drain or source terminals, no gate terminal, a path 26 to a voltage source (when transistor 30 is conducting), and a path to ground (when transistor 32 is conducting). For each node characteristic there is a corresponding field in the bit pattern. Similarly, node 50 is connected to three P channel transistors (one from each inverter), four N channel transistors, three inverters, a voltage source, a ground terminal, four gate terminals, and three drain/source terminals.

In addition to the generation of a bit pattern for each internal node, a bit pattern is generated for each external node as well. A field in the bit pattern is provided to indicate the node type. After all of the nodes of the circuit pattern have been analyzed with corresponding signature bit patterns generated, the collective bit patterns of the circuit pattern constitute the signature for the circuit pattern.

Figure 4:
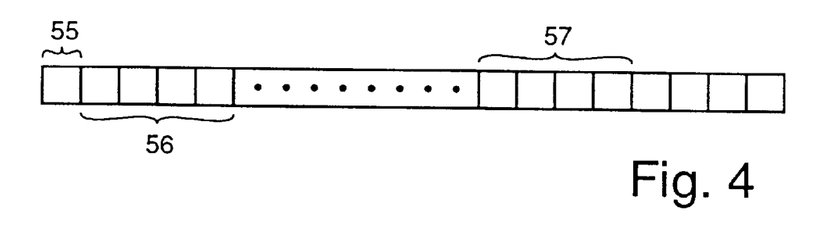
FIG. 4 shows a bit pattern representing a signature.

FIG. 4 illustrates a bit pattern with various fields. Field 55 may be a single bit indicating whether the node is an external node or internal node. Field 56 may indicate the number of P-channel transistor connections, and field 57 may indicate the number of N-channel connections. The specific format of the bit pattern can be defined as wished and can vary from implementation to implementation.

Referring back to FIG. 2, box 24, after generating the signature for the provided circuit pattern, a signature (a single bit pattern) for each of the nodes in the to-be-simulated circuit design are generated in likewise manner. In the next step 26, the most complex internal node bit pattern signature from the signature set of bit patterns is selected and compared with the node signatures of the given circuit design, where the most complex internal node bit pattern signature is the bit pattern having the most significant deviation from the default case (all zeros).

Since each node signature of the circuit design is a bit pattern of the same length having the same pre-defined fields, the comparison step becomes a simple bit pattern to bit pattern comparison operation, which is a very fast operation. However, in order to declare that a circuit pattern has been found in the circuit design, all of the nodes of the circuit pattern have to match the nodes in the circuit design in the correct connective interrelationship.

Thus, once a bit pattern is matched, the next internal node to be matched is determined and the interconnect relationship between the first matched node and the next node is determined. Once this determination is made, a search is made to attempt to match the corresponding internal node bit pattern of the circuit pattern with the corresponding node bit pattern of the circuit design. If successful, this search pattern continues until each internal node of the circuit pattern is matched with a corresponding node in the circuit design before declaring a match. In the case of external node bit patterns, each field of the corresponding bit pattern from the circuit design must be greater than the value in each corresponding field of the external node bit pattern.

Since there may be quite a few occurrences of the circuit pattern in the circuit design, every node of the circuit design is compared in order to find every possible circuit pattern. After this step, the locations of all the circuit patterns of interest would have been found. The process can be repeated for any other circuit pattern of interest before proceeding to the next step.

Figure 5A:
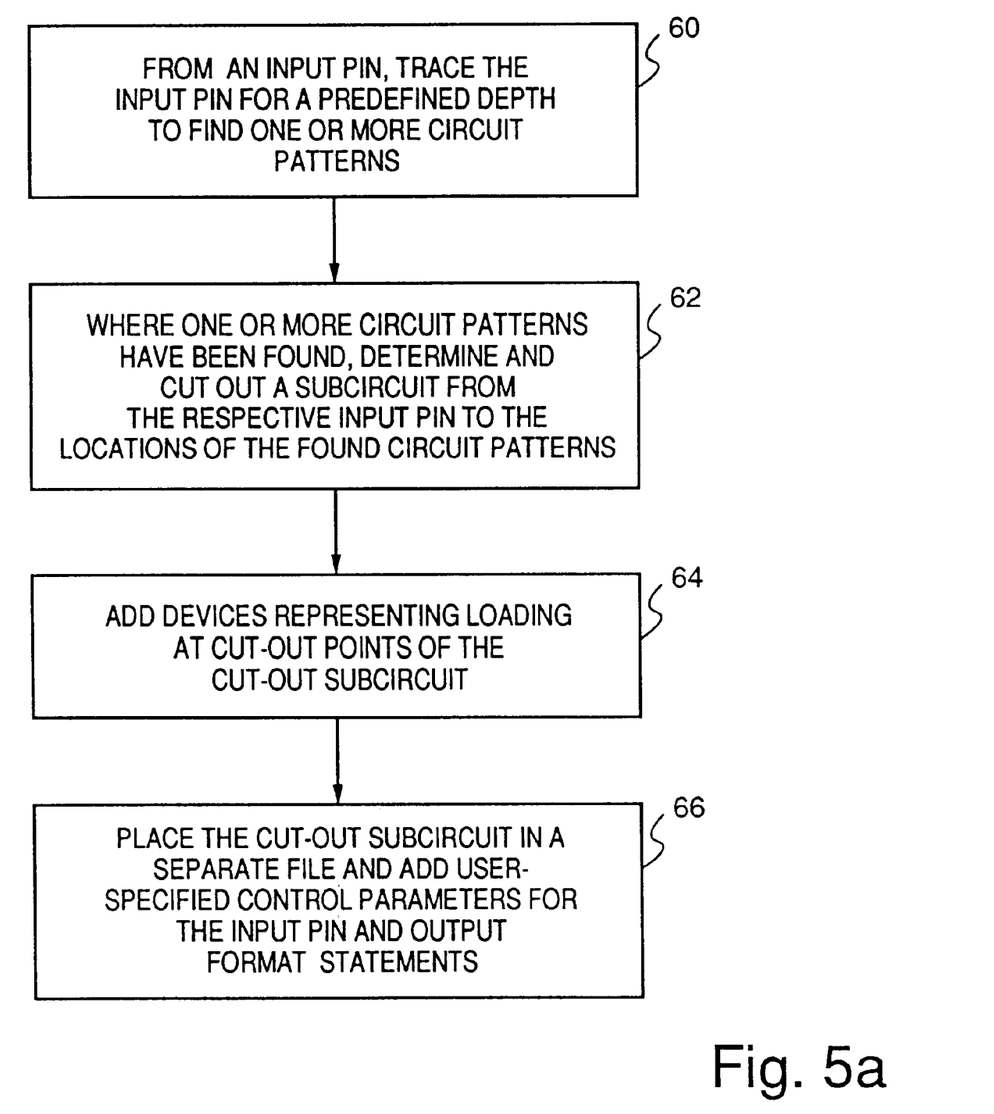
FIG. 5a shows a flow chart of the general steps in searching from an input pin to the circuit pattern(s) within the given circuit design, determining the subcircuit to be extracted, and extracting the subcircuit.

Having found all of the locations of the circuit patterns in the circuit design, referring to FIG. 5a, we are now interested in determining the relationship between the circuit patterns and the input pins. Reading the netlist of the circuit design and starting from a particular input pin, a forward search of a pre-defined depth (as defined by the number of circuit components) is initiated. If one or more of the circuit patterns are not found within the pre-defined depth, the search from this pin is terminated. If one or more circuit patterns are found, a backward search is initiated from each of the found circuit pattern in order to find all of the circuit components from the found circuit pattern back to the input pin. In this process, several input pins may be found to affect the characteristics of this particular input pin. The found circuit components constitute the subcircuit to be cut-out 62.

In cutting out a subcircuit, there may be several cut-out points connected to other parts of the circuit design. At these cut-out points, devices representing loading effects are added in order to preserve and provide accurate simulation results 64. The value or size of the added loading devices is individually calculated based upon the value(s) of the circuit component(s) at the cut-out point.

In the next step 66, the cut-out circuit is placed in a separate file where user-specified parameters for the particular input pin are added. If there are any other input pins in the same subcircuit, fixed-value parameters are added for these pins. Additionally, control statements for specifying the output format are added as well. At this point, this circuit can be run to simulate and determine the setup time, which is the minimum time required between the initiation of the input signal, the initiation of the clock signal and the generation of a valid latch output signal.

Figure 5B:
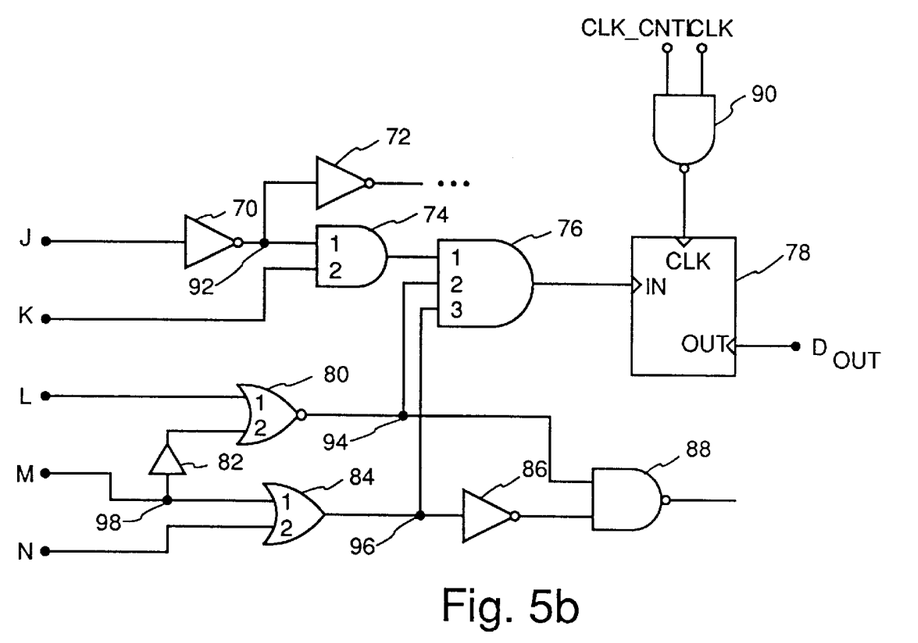
FIG. 5b illustrates a schematic diagram to demonstrate the forward search path in finding one or more latches and the backward search path in finding the pertinent input pins.

FIG. 5b illustrates a part of a sample circuit design for demonstrating the search path taken to find latches, the circuit to be cut-out, and the connecting of the loading devices.

The search starting from pin J moves forward to inverter 70 and proceeds to AND gate 74 and inverter 72. Since the forward search is depth-limited to so many components, if the signal path following inverter 72 does not lead to a latch within the depth limit, that search path would be terminated. From AND gate 74, the search path continues to AND gate 76 and eventually reaches latch 78. Having now found a latch, a backward search is conducted to find all of the circuitry to be included in the subcircuit to be extracted. In the backward search, each and every input to a connected component is back traced.

For example, from the input terminal of latch 78, the backward search traces every input branch of AND gate 76. Back tracing from the first input branch of AND gate 76, the trace goes to AND gate 74 and both of its input branches are back-traced. From the first input branch of AND gate 74, the signal path is back-traced to inverter 70 and to input pin J. From the second input branch of AND gate 74, the signal path is back-traced to input pin K. Similarly, from the second branch of AND gate 76, the signal path is back-traced to NOR gate 80 where its first input branch connects to input pin L and its second input branch leads to inverter 82 and to input pin M. Likewise, from the third input branch of AND gate 76, the signal path connects to OR gate 84 where its first input branch connects to input pin M and its second input branch connects to input pin N.

In this manner, with respect to input pin J, the circuit to-be-extracted to represent timing and signal characteristics at pin J includes inverter 70, AND gate 74, AND gate 76, latch 78, NOR gate 80, inverter 82, and OR gate 84.. There are three cut-out points with respect to this circuit and they are at nodes 92, 94, and 96. An appropriate load device is calculated and added at each of these nodes. These circuit components and the added load devices are placed in a separate netlist file to represent this input pin.

The other input pins are similarly forward searched and backward traced to find relevant circuit components. If the clock signal is of interest, a backward search can be conducted from the clock terminal of the latch. As we shall see, this is of particular interest in the clock-tree application of the present invention.

Figure 6A:
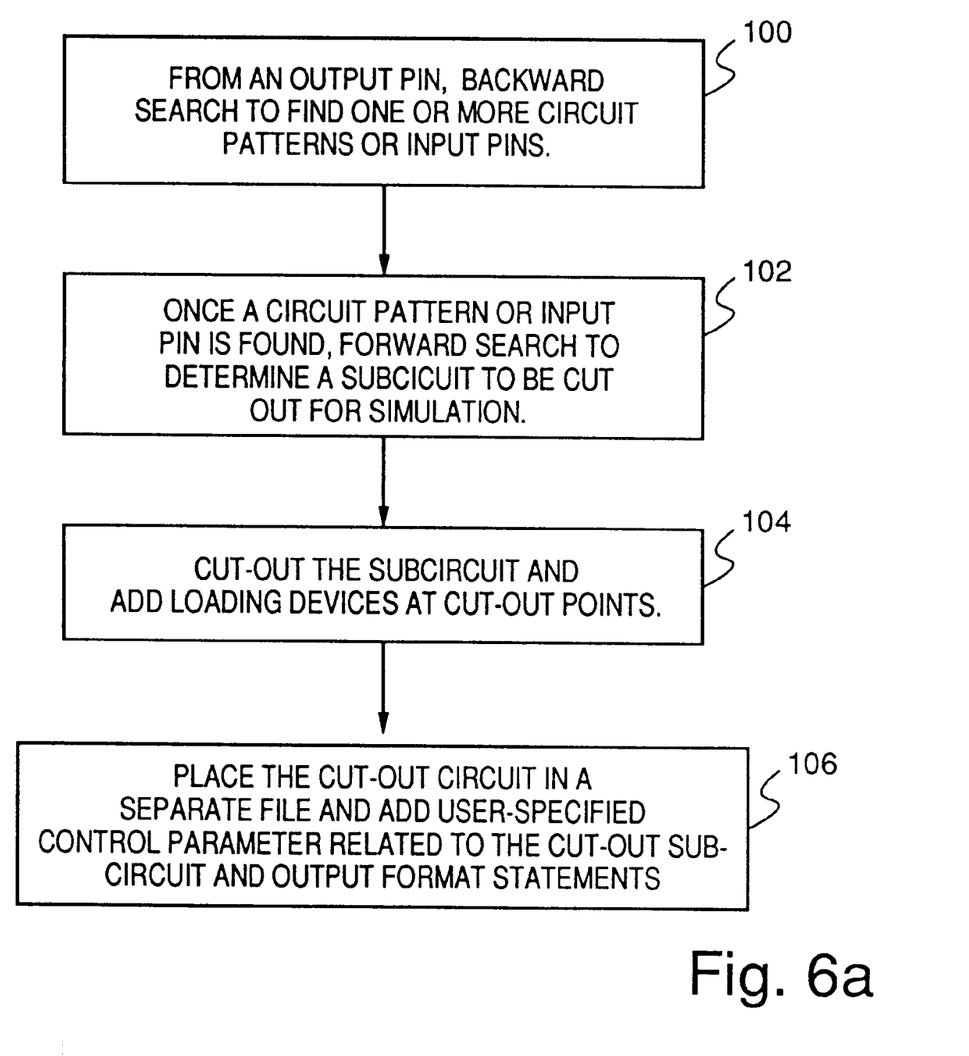
FIG. 6a shows a flow chart of the general steps in searching from an output pin to a particular circuit pattern, determining the subcircuit to be extracted for the corresponding output pin, and extracting the subcircuit.

After searching from each of the input pins, a search from each of the output pins to the specified circuit pattern (e.g. latch) is conducted. Referring to FIG. 6a, the general steps in searching each of the output pins is illustrated. From an output pin, a backward search is conducted in order to find one or more of the circuit patterns. If a circuit pattern is found, another backward search is conducted from the output pin to all possible input pins in order to determine the components of the circuit to be cut-out. The search stops when the related circuit patterns and input pins are found, thereby providing a fairly complete characterization of the output pin. The goal of this type of search is to find one or more circuit patterns, where the user is typically interested in observing the clock delay time (which is the time between the initiation of the clock signal at the clock terminal of the latch and the generation of the signal of the output pin).

A third type of search is conducted from the specified input pin to the specified output pin. No circuit pattern is required to be found in this type of search. The search from the specified output pin may continue (if the search is not depth limited by the user) until one or more input pins are encountered. Of course, the specified input pin must be found in order to cut out the desired part of the circuit and to determine the boundary of the cut-out circuit 102. In this type of search, the user is interested in the delay time between the initiation of a signal at the input pin(s) and the generation of a signal at the output pin of interest.

Once the cut-out circuit is determined, load devices are added at the cut-out points 104. The cut-out circuit is then placed in a file, where user-specified parameters for the output pin and the control statements for the desired output format are added.

At this stage, there is a SPICE file for the output pin, and the pin can be simulated using a variety of parameters to generate corresponding outputs, including the hold time for a given output capacitance.

Figure 6B:
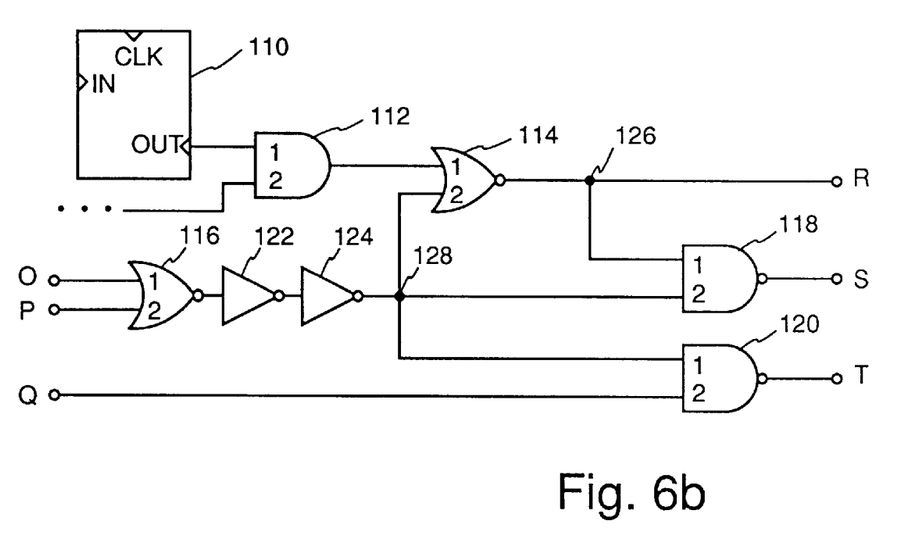
FIG. 6b illustrates a schematic diagram to demonstrate the backward search path in finding one or more latches and the forward search path in finding the pertinent output pins.

FIG. 6b illustrates a part of a sample circuit for demonstrating searching from an output pin, determining and cutting out of a subcircuit, and the adding of load devices.

Starting from output pin R, the backward search leads to NOR gate 114, which leads to on one branch AND gate 112 and latch 110, and on another branch inverters 122 and 124, NOR gate 116, and input pins O and P. Note that the second input branch of AND gate 112 may be connected to more circuit components upstream and would be included in subcircuit as well. Having found a latch within the prescribed depth, this subcircuit would then be cut-out and placed in a separate netlist. There would be a cut-out point at node 128 which is replaced by a load device.

For output pin S, the backward search would find a different subcircuit then that of output pin R. The NAND gate 118 is included for the case of output pin S, but not for output pin R. For output pin T, no latch would be found from the search. If the user is interested in the timing and characteristics of the signal at output pin T in relation with the related input pin O, a search would result in a subcircuit that includes input pins O, P, and Q, NOR gate 116, inverters 122 and 124, and NAND gate 120.

Memory Application of the Present Invention

The above described embodiment of the present invention is not limited to reducing VLSI/ULSI circuit designs of any particular type. A modification of the above described embodiment can be tailored to specific applications, one of which is in memory design application.

Figure 7A:
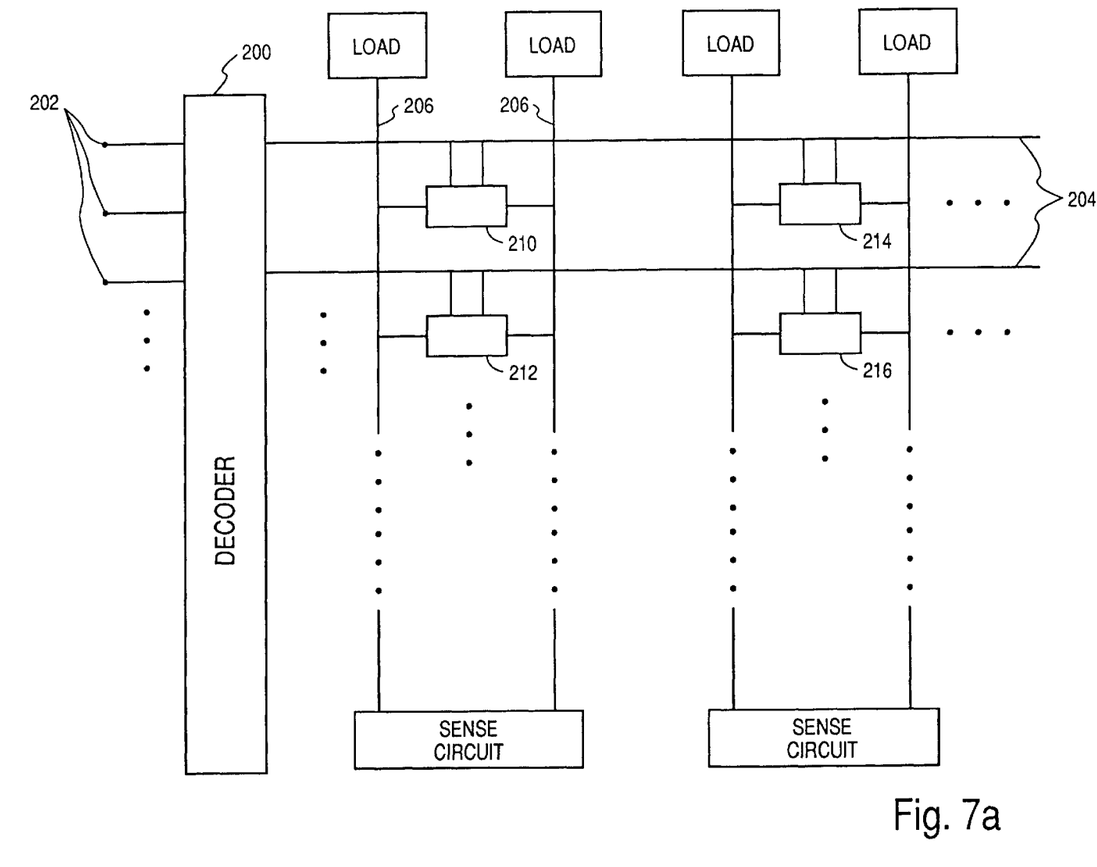
FIG. 7a illustrates a general memory circuit design.

Referring to FIG. 7a, a general circuit design of a memory device is illustrated. Given an address 202, the decoder 200 decodes the given address and activates selected ones of the word line 204, bit line 206, and bit_b line 208, in order to read or write to one or more selected memory cells (210–216).

For a given address, only selected ones of the memory cells are active. In simulating a memory circuit design, only those active memory cells need to be simulated. Thus, by extracting and simulating only the active memory cells, the amount of circuit material for simulation, is drastically reduced and thereby significantly improving simulation speed.

Figure 7B:
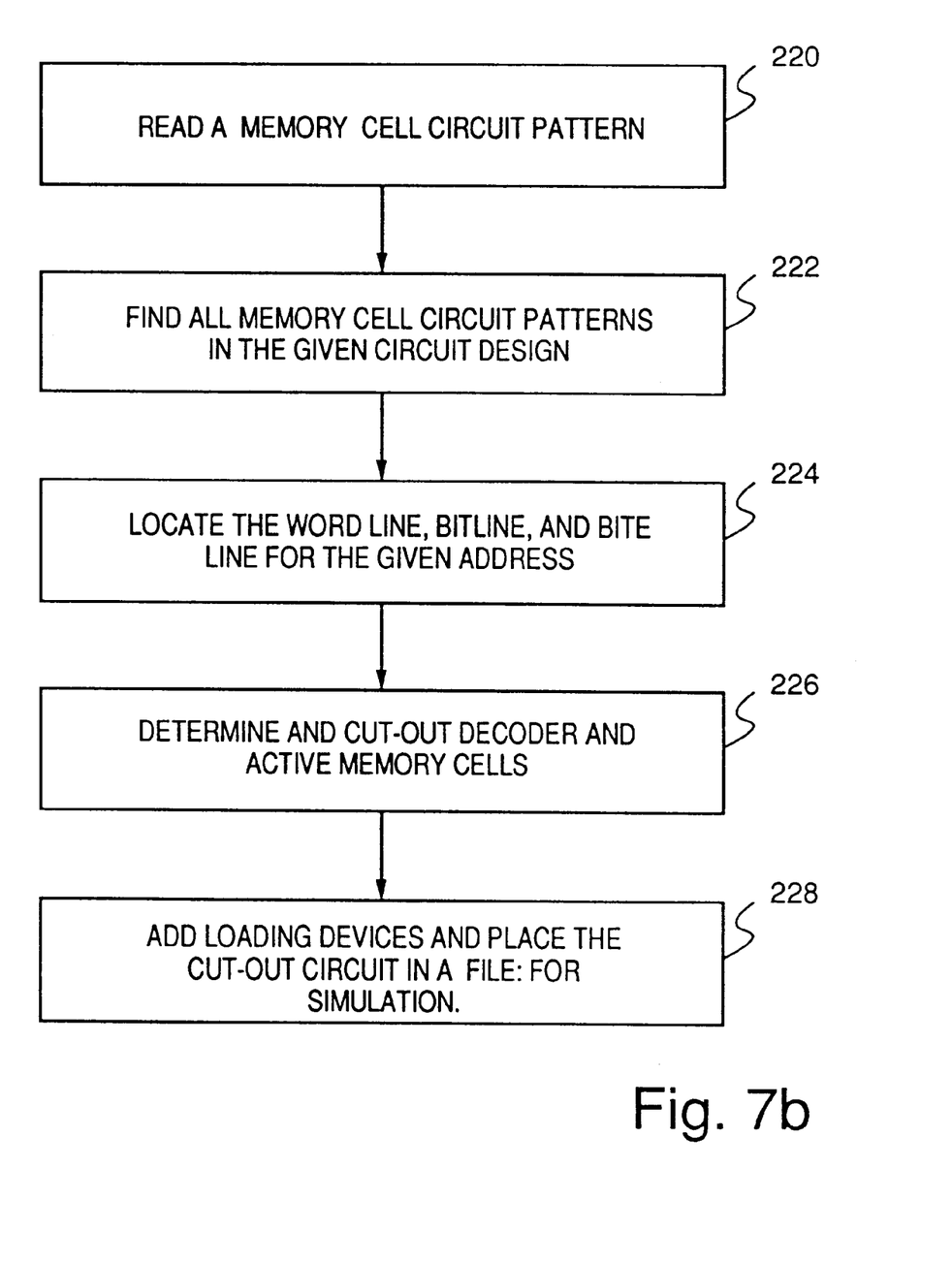
FIG. 7b shows a flow chart of the general steps in applying an embodiment of the present invention to memory circuit designs.

FIG. 7b illustrates the steps in selecting and cutting out the active memory cells. First of all 220, the memory cell pattern provided by the user is read and the locations of the memory cell pattern are determined by the method described above 222. For the given memory address, logic simulation of the decoder is performed in order to find the corresponding active word line, bit line and bit b line 224. Once these lines are determined, the memory cells connected to these lines can be determined as well 226. Along with the decoder, these memory cells are cut-out and placed in a separate SPICE file 228. Again loading devices can be added at cut-out points and user-specified input parameters are included. This memory subcircuit can therefore be simulated to generate a number of output values for examination and testing purposes.

Note that there may be a large number of cut-out points where there is one or more loading devices at each cut-out point. Since each loading device may be a pi-shaped RC network and are basically the same loading device, a single representation of a "lumped" loading device may be used where the value of this "lumped" loading device is a multiple of the number of the individual loading devices. In other words, the active bit/bitb lines can be modeled by a number of segments specified by the user where each segment can be represented by a pi-shaped RC network and a MOSFET with a multiplier instead of multiple pi-shaped RC networks and MOSFETs.

Yet another simulation scheme is possible under the present invention. Since the memory cells are structured in a regular pattern, the configurations of memory array can be constructed just before the designated read/write access between cells. The loadings and cell positions, which are time-variant, can be modeled using time-dependent resistance and capacitance, which are controlled by input address and control signals. In this manner, we only need a limited number (maybe 4) of memory cells to model an entire array, and the amount of memory required is significantly reduced in simulation.

Clock Tree Generation Application

The present invention can also be applied in the area of clock signal analysis. For a given circuit, there may be a number of components such as latches that are connected to the clock signal. Since the connection of the clock signal to these components may pass through a number of other circuit components, it is important to observe and ensure that the clock signal to these connected components are synchronized within an acceptable tolerance.

Figure 8:
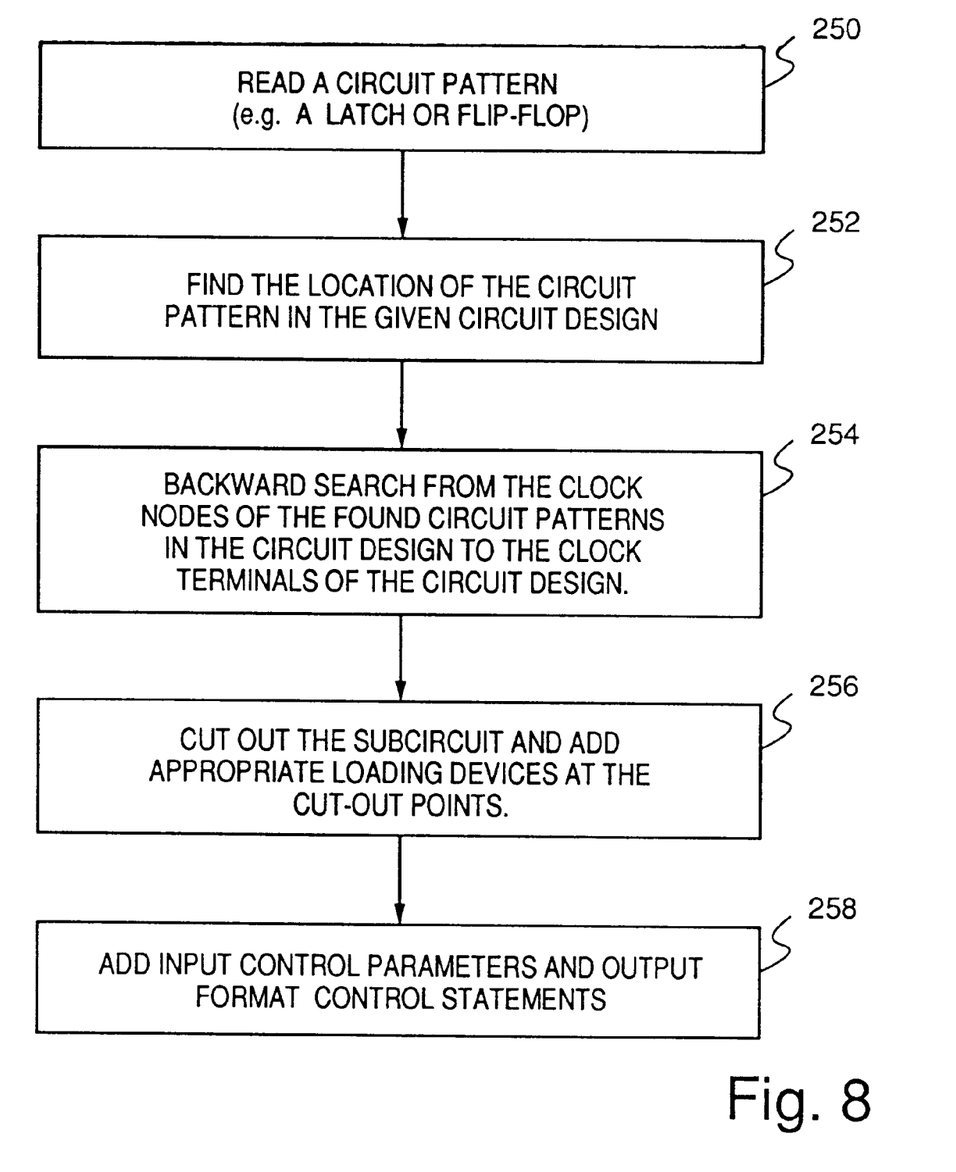
FIG. 8 shows a flow chart of the general steps in applying an embodiment of the present invention to clock tree applications.

Referring to FIG. 8, the first step in this process is to read in one or more circuit patterns of interest, typically a latch of some type 250. The location of the circuit pattern in the given to-be-simulated circuit design is then determined 252. Since the circuit pattern here would typically have a clock terminal, a backward search from each of the clock terminals of the found circuit pattern back to the clock pin of the circuit design is conducted. After the search, all of the circuit components affecting the clock signal are then determined and copied from the circuit design and placed in a separate file where loading devices again can be added at the cut-out points 256. To simulate the cut-out circuit, user-specified input parameters and output control statements are added to the file.

Abstraction of a Circuit Design

Given the method of finding a given circuit pattern in a circuit design, the present invention can be applied to abstract a circuit design from a representation at the transistor level to a representation at the block, cell, or gate level. For example, given the circuit pattern for a latch in terms of gates and a circuit design in terms of transistors (which may include some representation at the gate level), the circuit pattern representation at the gate level can be translated to the transistor level and a signature generated for the circuit pattern at the transistor level. Through the circuit pattern search method described above, the locations of the circuit patterns within the circuit design can be found. Once a circuit pattern is matched within the circuit design, the matched portion of the circuit design can be substituted by the gate level representation of the circuit pattern. In this manner, the entire circuit design can be abstracted from the transistor level to the gate level if the corresponding circuit patterns are found.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

What I claim is:

1. A method for simulating timing and signal characteristics at a pin of a circuit design including a plurality of input pins, a plurality of output pins, one or more clock pins, and a plurality of interconnected circuit components connected to said input/output/clock pins and having a plurality of identifiable nodes, comprising the steps of:
    defining a circuit pattern the position or positions of which is to be located in said circuit design;
    identifying the one or more locations where said circuit pattern resides in said circuit design;
    tracing from an input/output/clock pin of said circuit design to one or more of the identified circuit pattern locations to identify a particular interconnecting sub-circuit;
    extracting and storing a description of said interconnecting sub-circuit;
    assigning user specified parameters to said description of said interconnecting subcircuit; and
    simulating the sub-circuit using said description to generate a signal having the timing and signal characteristics of the signal generated by said circuit design at said pin.

2. A method as recited in claim 1 wherein said identifying step is further comprised of the sub-steps of:
    a) generating a circuit pattern signature for said circuit pattern;
    b) generating a node signature for each node of said circuit design;
    c) comparing said circuit pattern signature with the node signature of a selected node of said circuit design;
    d) if said circuit pattern signature matches said node signature, marking the location of said node; and
    e) repeating steps c) to d) for every node of said circuit design.

3. A method as recited in claim 2 wherein said circuit pattern signature is a set of bit patterns each of which is representative of the connective characteristics of a node in said circuit pattern.

4. A method as recited in claim 3 wherein each of the node signatures is a bit pattern representative of the connective characteristics of a corresponding node in said circuit pattern.

5. A method as recited in claim 4 wherein each of the bit patterns of said circuit pattern signature and the bit pattern for each of the node signatures have the same length and the same predefined fields defining the connective characteristics of the nodes.

6. A method as recited in claim 5 wherein said comparing sub-step of claim 2 further includes the sub-steps of:
    matching a bit pattern of said circuit pattern signature with the bit pattern of the selected node signature;
    if the selected bit pattern of said circuit pattern signature matches the bit pattern of the selected node signature, comparing the other bit patterns of said circuit pattern with the other node signatures of said circuit design in the corresponding connective relationship; and
    if the other bit patterns of said circuit pattern signature match the other node signatures of said circuit design in the corresponding connective relationship, marking the location of said node.

7. A method as recited in claim 1 wherein said tracing step is depth-limited to tracing a predefined number of the components.

8. A method as recited in claim 1 wherein said circuit pattern is a latch.

9. A method as recited in claim 1 wherein display format control parameters are added to said subcircuit for controlling the displaying of the signal generated by said subcircuit.

10. A method as recited in claim 1 wherein said extracted subcircuit has a number of cut-out points and a load device is connected at each of said cut-out points.

11. A method as recited in claim 1 wherein said pin is an input pin.

12. A method as recited in claim 1 wherein said pin is an output pin.

13. A method as recited in claim 1 wherein said pin is a clock pin.

14. A method as recited in claim 1 wherein said extracted subcircuit includes circuit components found from using a breadth-first search, said search starting from said traced circuit patterns back to said pin.

15. A method as recited in claim 1 wherein said extracted subcircuit includes circuit components found from using a depth-first search, said search starting from said traced circuit patterns back to said pin.

16. A method for simulating timing and signal characteristics at a pin of a memory circuit design including a plurality of input pins, a plurality of output pins, one or more clock pins, a plurality of control lines, an address decoder, and a plurality of interconnected memory components connected to said input/output/clock pins, said control lines and said address decoder, said decoder communicatively connected to said input pins for receiving memory addresses, said circuit design having a plurality of identifiable nodes, comprising the steps of:
    defining a memory cell circuit pattern the position or positions of which is to be located in said memory circuit design;
    identifying one or more locations where said memory cell circuit pattern reside in said memory circuit design;
    providing a memory address at said input pins;
    determining control lines activated by said provided memory address;

determining the locations of said identified memory cell circuit pattern associated with said active control lines;

extracting and storing a description of a subcircuit including said active control lines and said determined memory circuit patterns;

adding user specified parameters to said description of said subcircuit; and simulating said subcircuit to generate a signal having timing and signal characteristics of the signal generated by said memory circuit design at said pin.

17. A method as recited in claim 16 wherein said memory address provided at said input pins is decoded by logic simulation using said decoder.

18. A method as recited in claim 16 wherein said subcircuit includes said decoder.

19. A method as recited in claim 16 wherein said active control lines include word lines, a bit lines, and a bitb lines.

20. A method as recited in claim 16 wherein said extracted subcircuit has a number of cut-out points and a load device is connected at each of said cut-out points.

21. A method as recited in claim 20 wherein a group of said load devices are combined into one load device as specified.

22. A method for simulating timing and signal characteristics at a pin of a circuit design including a plurality of input pins, a plurality of output pins, one or more clock pins, and a plurality of interconnected circuit components connected to said input/output/clock pins and having a plurality of identifiable nodes, comprising the steps of:

defining a circuit pattern the position or positions of which is to be located in said circuit design, said circuit pattern having a clock terminal;

identifying one or more locations where said circuit pattern resides in said circuit design;

tracing from an input/output/clock pin of said circuit design to one or more of the identified circuit pattern locations;

tracing from the clock terminals of the traced circuit pattern to the one or more clock pins of said circuit design to identify a particular interconnected subcircuit;

extracting and storing a description of said subcircuit;

adding user specified parameters to said description for said subcircuit; and simulating said subcircuit using said description to generate a signal having the timing and signal characteristics of the signal generated by said circuit design at said pin.

23. A method for changing a circuit design having a representation at the transistor-level to a representation at the block-level, comprising the steps of:

defining a circuit pattern the position or positions of which is to be located in said circuit design, said circuit pattern having a representation at the block-level and a representation at the transistor-level;

identifying one or more locations where said circuit pattern reside in said circuit design, said circuit pattern being in a representation at the transistor level; and substituting said identified circuit pattern in said circuit design from a representation at the transistor-level to a representation at the block-level.

24. A method as recited in claim 23 wherein said block-level representation is a representation at the gate level.

25. A method as recited in claim 23 wherein said block-level representation is a representation at the cell level.

* * * * *